United States Patent
Raschke

(10) Patent No.: US 9,073,149 B2
(45) Date of Patent: Jul. 7, 2015

(54) METHOD FOR FIXING A COMPONENT IN A CASING AND ASSEMBLY HEREOF

(71) Applicant: ZF Friedrichshafen AG, Friedrichshafen (DE)

(72) Inventor: Dirk Raschke, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 81 days.

(21) Appl. No.: 13/957,543

(22) Filed: Aug. 2, 2013

(65) Prior Publication Data

US 2013/0313233 A1 Nov. 28, 2013

Related U.S. Application Data

(62) Division of application No. 13/016,279, filed on Jan. 28, 2011, now Pat. No. 8,549,913.

(30) Foreign Application Priority Data

Feb. 2, 2010 (DE) .......................... 10 2010 001 493

(51) Int. Cl.
*H01G 9/08* (2006.01)
*H01M 2/02* (2006.01)
*B23K 26/20* (2014.01)
*B23K 26/00* (2014.01)
(Continued)

(52) U.S. Cl.
CPC ........... *B23K 26/20* (2013.01); *Y10T 29/49124* (2015.01); *Y10T 29/49826* (2015.01); *B23K 26/0021* (2013.01); *B29C 65/1635* (2013.01); *B29C 65/7835* (2013.01); *B29C 66/112* (2013.01); *B29C 66/114* (2013.01); *B29C 66/1142* (2013.01); *B29C 66/54* (2013.01); *B29L 2031/3481* (2013.01); *G01D 11/245* (2013.01); *B29C 65/16* (2013.01); *H05K 13/04* (2013.01); *B29C 66/542* (2013.01)

(58) Field of Classification Search
CPC .................................... H01M 2/02; H01G 9/08
USPC ............................................................ 73/431
See application file for complete search history.

(56) References Cited

U.S. PATENT DOCUMENTS 5,161,540 A 11/1992 Mueller
5,873,899 A 2/1999 Stutz, Jr. et al.
(Continued)

FOREIGN PATENT DOCUMENTS

DE 199 83 799 T1 1/2002
DE 10 2005 000 160 B4 7/2008
(Continued)

*Primary Examiner* — Lisa Caputo
*Assistant Examiner* — Jamel Williams
(74) *Attorney, Agent, or Firm* — Micheal J. Bujold; Davis & Bujold, P.L.L.C.

(57) ABSTRACT

A method of fixing a functional component (2) in a housing (4). During a first step, a first housing portion (1) is prepared in which a functional component (2), to be fixed, is arranged in a provisional fixing position. During a second step, a second housing portion (3) is brought into contact with the first housing portion (1) so that the functional component (2) is arranged in a joining direction (X) between the housing portions (1, 3). During a third step, material from at least one of the housing portions (1, 3) is melted in such manner that the functional component (2), located between the housing portions (1, 3), is gripped in position when a material-integral bond is formed between the housing portions (1, 3).

10 Claims, 3 Drawing Sheets

(51) Int. Cl.
*B29C 65/78* (2006.01)
*B29C 65/00* (2006.01)
*G01D 11/24* (2006.01)
*H05K 13/04* (2006.01)
*B29C 65/16* (2006.01)
*B29L 31/34* (2006.01)

(56) References Cited

U.S. PATENT DOCUMENTS

| | | | |
|---|---|---|---|
| 6,111,760 A | 8/2000 | Nixon | |
| 7,394,661 B2* | 7/2008 | Wang et al. | 361/737 |
| 7,433,196 B1* | 10/2008 | Wang et al. | 361/752 |
| 8,248,809 B2* | 8/2012 | Miller et al. | 361/752 |
| 8,549,913 B2* | 10/2013 | Raschke | 73/431 |
| 2005/0191472 A1* | 9/2005 | Oonishi | 428/200 |
| 2006/0220051 A1* | 10/2006 | Fung et al. | 257/99 |
| 2006/0281229 A1* | 12/2006 | Koh et al. | 438/127 |
| 2007/0064403 A1* | 3/2007 | Badarinarayan et al. | 361/796 |
| 2007/0204954 A1 | 9/2007 | Brunnecker et al. | |
| 2007/0228106 A1 | 10/2007 | Brunnecker et al. | |
| 2007/0251565 A1* | 11/2007 | Erbstoeszer et al. | 136/232 |
| 2008/0050649 A1* | 2/2008 | Goldstein et al. | 429/176 |
| 2008/0165517 A1* | 7/2008 | Wang et al. | 361/800 |
| 2009/0266573 A1* | 10/2009 | Engmark et al. | 174/50.54 |
| 2010/0254104 A1* | 10/2010 | Blake, III | 361/757 |
| 2012/0120562 A1* | 5/2012 | Prest et al. | 361/679.01 |

FOREIGN PATENT DOCUMENTS

| | | |
|---|---|---|
| DE | 10 2009 043 201 A1 | 4/2011 |
| FR | 2 657 490 A1 | 7/1991 |
| WO | 2011/035771 A1 | 3/2011 |

* cited by examiner

METHOD FOR FIXING A COMPONENT IN A CASING AND ASSEMBLY HEREOF

This application is a divisional of U.S. patent application Ser. No. 13/016,279 filed Jan. 28, 2011, which claims priority from German patent application serial no. 10 2010 001 493.1 filed Feb. 2, 2010.

FIELD OF THE INVENTION

The present invention concerns a method for fixing a functional component in a housing. The invention also concerns an arrangement formed by the method.

BACKGROUND OF THE INVENTION

In the prior art numerous methods for fixing functional components in a housing are known, for example with positive interlock, friction force retention, material-integral bonding, or combinations of these. Some of these methods involve numerous process steps and, to that extent, entail long tolerance chains. The costs incurred to achieve a desired positioning accuracy and a desired positional fidelity relative to a housing, as required in particular for sensor arrangements, are therefore considerable.

For example, in the prior art it is known to fix functional components in their intended position in a housing by means of a welding process, in which a first joint partner is welded under pressure to a second joint partner, for example by a laser irradiation method, such that the melted material of one joint partner forms an interlocked connection with the functional component to be fixed. Such a method is described in the document DE 10 2005 000 160 B4. In this method it is significant that the melted material that creates the interlocked joint with the functional component to be fixed, of course makes contact with the functional component. This demands exact control of the setting path and leaves room for tolerance deviations.

SUMMARY OF THE INVENTION

Starting from there the purpose of the present invention is to propose a method for fixing a functional component in a housing and an arrangement obtained therefrom, which overcome the drawbacks of the prior art and so enable simple, substantially tolerance-free fixing with comparatively few process steps and hence low costs.

According to the invention, a method is proposed for fixing a functional component in a housing, such that in a first step a first housing portion is prepared by arranging a functional component, to be fixed, in a provisional fixing position; in a second step, a second housing portion is arranged in contact with the first housing portion in such manner that the functional component to be fixed is arranged in a joining direction between the first and second housing portions; and in a third step, material of at least one housing portion is melted between the first and second housing portions, in such manner that the functional component arranged between the first and second housing portions in a predetermined fixing position is gripped by the first and second housing portions with the formation of a material-integral bond between the housing portions.

According to one aspect of the method according to the invention, in the third step the first housing portion and the second housing portion are pressed against one another during the melting of material, particularly in the joining direction.

According to another aspect of the method according to the invention, a laser welding technique is used for melting the material.

In the method according to the invention it is provided that the first and/or the second housing portion has an area of fusible material provided in order to form the material-integral bond.

In one aspect of the method according to the invention, by means of the material-integral bonding of the first and second housing portions a housing is formed, which contains the functional component, in particular a housing impermeable to media.

According to the invention it is also possible to monitor the force during melting, in order to grip the functional component with the requisite pressure force between the first and second housing portions by means of the material-integral bond.

In the context of the method according to the invention it is proposed that in the second step a second functional component is arranged on the second housing portion in a provisional fixing position, in such manner that it is opposite the first functional component in the joining direction.

According to one aspect of the method according to the invention, after being clamped the first and second functional components are in contact with one another owing to the formation of a material-integral bond.

According to another aspect of the method according to the invention, the first and/or second housing portions have fixing elements for the provisional fixing of one functional component before gripping and/or to enable gripping.

In one aspect of the method according to the invention, the first and/or second housing portion(s) is/are part(s) of a sensor housing.

Furthermore, in the method according to the invention it is provided that the functional component comprises a printed circuit or a Hall sensor or a flux-conducting element.

According to the invention an arrangement is proposed, in particular a sensor arrangement, which consists of a first and a second housing portion and a functional component, such that the functional component is gripped between the first and second housing portions and, to grip the functional component, the first and second housing portions are connected by a material-integral bond.

In an embodiment of the arrangement according to the invention, by virtue of the material-integral bond the first and second housing portions form a housing in which the functional component is accommodated, in particular a housing impermeable to media.

In a further embodiment of the arrangement according to the invention the first and/or second housing portion(s) has/have a fixing element for gripping the functional component.

In yet another embodiment of the arrangement according to the invention the first and second housing portions are each part of the sensor housing.

Furthermore, according to the invention an arrangement is proposed such that the functional component is part of the sensor system of a sensor, in particular a flux-conducting element, a printed circuit or a Hall sensor.

According to the invention an arrangement is also proposed, such that a first and a second functional component are gripped in contact with one another between the first and second housing portions by virtue of the material-integral bond between the housing portions.

Further features and advantages of the invention emerge from the description of example embodiments of the invention given below with reference to the figures in the drawings, which illustrate details essential to the invention, and from the claims.

The individual features can be implemented either per se in isolation or several at a time in any desired combination in variants of the invention.

BRIEF DESCRIPTION OF THE DRAWINGS

Below, preferred embodiments of the invention are explained in more detail with reference to the attached drawings, which show.

DETAILED DESCRIPTION OF THE PREFERRED EMBODIMENTS

In the description below and the drawings, the same indexes are used for elements having the same or comparable functions.

Figure 1A:
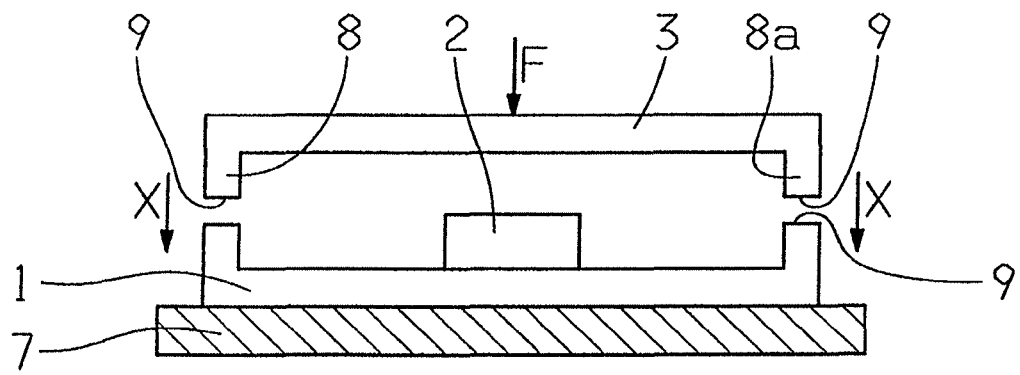
FIG. 1a) As an example, a cross-section of an arrangement of a functional component to be fixed between a first and a second housing portion, before the formation of a material-integral bond between the housing portions, according to one possible embodiment of the invention.

As an example, FIG. 1a shows an arrangement for implementing the method according to the invention, which consists of a first housing portion 1, a functional component 2 and a second housing portion 3, the first 1 and second 3 housing portions being joint partners by means of which a housing 4 can be formed as the result of a joining process, in particular the formation of a material-integral bond.

Figure 1B:
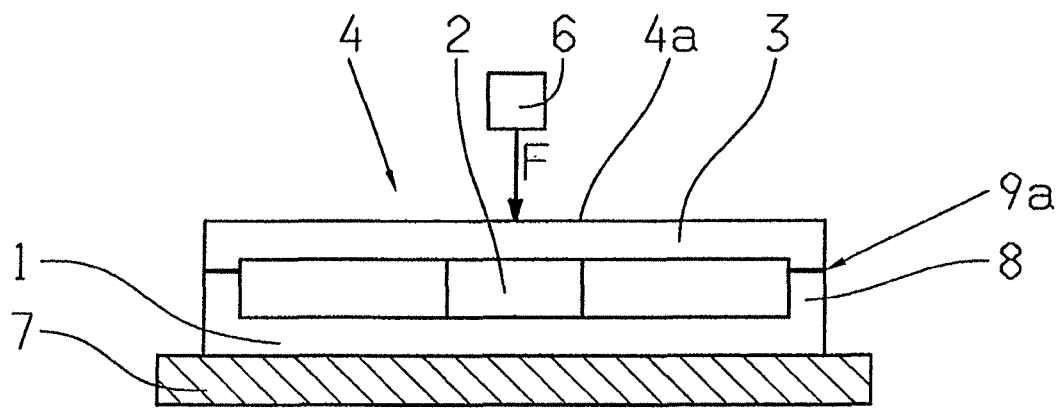
FIG. 1 b) As an example, the arrangement in FIG. 1 after forming the material-integral bond.

A housing 4 (FIG. 1b) that can be made according to the invention by the joint partners, i.e. the first and second housing portions 1, 3, serves for example to accommodate and affix the functional component 2, in particular for example for its protection, for example against environmental influences, aggressive media and mechanical effects. Accordingly, the effort is made to make the housing 4 impermeable for example to gases, liquids or other media and to make it strong, as necessary for example in the case of sensor housings, particularly ones intended for use in harsh surroundings. By means of a material-integral bonding process, besides joining the joint partners the necessary impermeability and strength can also be achieved. The joint partners or housing portions 1, 3 can for example be made of plastic or metal or other suitable materials, and it is also conceivable for one joint partner to comprise different materials.

In the housing 4 a functional component 2 is to be accommodated and fixed as positionally accurately as possible, for example in such manner that it can be secured against slipping or rattling and is not affected by tolerances. Furthermore the functional component 2 should be held in an exact position, for example a specified distance away from one side 4a of the housing 4 formed. To achieve such permanent fixing, in particular positionally accurate fixing unaffected by tolerances, according to the invention in a first step the first housing portion 1 is prepared, for example the lower part of a housing. The functional component 2 is arranged in the first housing portion 1 in a provisional fixing position, although the term 'provisional fixing position' relative to the first housing portion 1, where the functional component is placed in the first step, can also refer to a final, specified fixing position.

The functional component 2 is for example a functional element, in particular for example an electronic element or a group of elements that form in particular an integral unit such as a printed circuit 10 with components in place, even for example a multi-layer printed circuit, or an electronic module, etc.

In a second step the second housing portion 3 is placed on the first housing portion 1 in particular so as to make contact with it, in particular so that a sandwich arrangement is formed within which the functional component 2 is located between the first 1 and second 3 housing portions. The functional component 2 is arranged or held in the joining direction X between the first 1 and second 3 housing portions, i.e. in the direction in which the first 1 and second 3 housing portions will have to be moved toward one another for the joining process according to the invention. The joint partners 1, 3 are for example designed such that the functional component can be encapsulated in the housing 4 to be formed.

To enable the functional component 2 to be clamped or held firmly between the joint partners 1, 3 by a material melting process in a subsequent, third step, one or both housing portions 1, 3 have one or more projections or contact elements 8, in particular parallel to the joining direction X, which serve in each case to come into contact with the other joint partner, particularly in contact positions 9 designed for the formation of the material-integral bond. The contact elements 8 can for example be in the form of a circumferential lip or ridge, or web elements, for example welding fillets 8b designed specially for the purpose (FIGS. 3a) and b)). Thus, a contact element 8 of at least one joint partner 1, 3 forms for example a material area 8a provided in order to be melted.

According to the invention it is provided that the contact elements 8 of the housing portions 1 and 3 are designed such that, before the material-integral bond is formed, respective contact elements 8 which are to be integrally joined to one another at specific contact positions 9 prevent gripping of the functional component 2 when it is positioned on the respective other joint partner 1 or 3, for example by a suitable extension of their length or an appropriate excess of material parallel to the joining direction X.

Then, in a third step the functional component 2 arranged in this way is gripped, i.e. between the first 1 and second 3 housing portions, when a material-integral bond is formed between the first 1 and second 3 housing portions by the joining process concerned. To grip the functional component 2, so enabling it to be fixed particularly firmly in the intended fixing position, some material of at least one housing portion 1 or 3, for example a contact element 8 or its fusible material area 8a, is removed or leveled between the first housing portion 1 and the second housing portion 3, in particular melted, i.e. in the joining direction X, so that the first 1 and second 3 housing portions move toward one another in the joining direction X, for example with the help of guiding means which allow exact positioning of the housing portions 1, 3 relative to one another.

During the melting of material from at least one joint partner 1, 3 it is preferable to apply pressure on at least one of the partners so that they are pressed against one another. This can be done, for example, by applying a pressing force F for example by means of a pressing device 6 onto the second housing portion 3 while the first housing portion 1 is placed on and supported by a supporting base 7. For this purpose the pressing device 6 can comprise a suitable tool such as a pressing frame.

The material between the first 1 and second 3 housing portion joint is melted until, and for example controlled in such manner that, the functional component 2 is gripped between the first 1 and second 3 housing portions, in particular with the desired pressure force F. This can be done for example by pressure force monitoring means which can for example be part of a process control system. In particular, gripping can take place for example directly by the housing portions 1, 3.

As a result of the melting of material, the joint partners 1, 3 form a material-integral bond with one another, in particular a permanent joint. The settling distance can be monitored during the joining process, i.e. the separation decrease between the joint partners 1, 3, for example in order to ensure uniform contact of the joint partners 1, 3 against the functional component 2.

For the removal or melting of material according to the invention, for example a welding process is used, for example a laser welding method such as a known laser irradiation process in which one of the joint partners 1 or 3 transmits the laser radiation while the other absorbs it. For example, a weld seam 9a formed by the joining process constitutes the material-integral bond, for example for the permanent formation of the housing 4.

To grip the functional component 2 between the first 1 and second 3 housing portions, the first 1 and/or the second 3 housing portion can rest directly (FIGS. 1a) and 1b)) or indirectly (FIGS. 2a) to 2c)) against the functional component 2 as the material is melted, and in the case of direct contact one of the respective housing portions 1 or 3 can serve to draw off the heat.

Figure 2A:
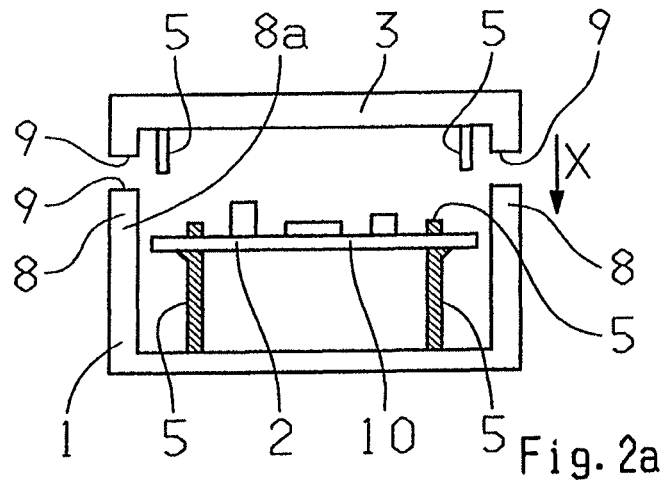
FIGS. 2a) to c) Example section showing the arrangement of a functional component to be fixed between a first and second housing portion according to another possible embodiment of the invention, such that the functional component is gripped by means of fixing elements and by the formation of a material-integral bond.
Figure 2B:
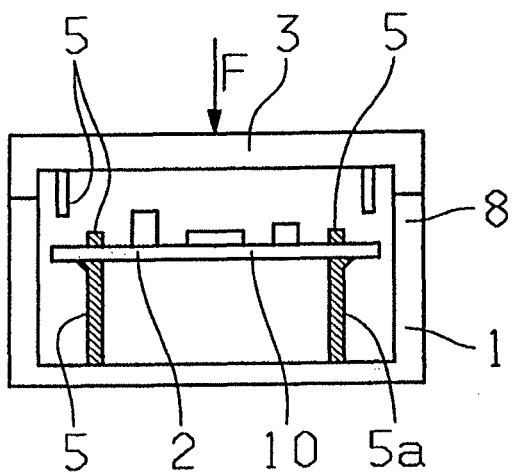
Figure 2C:
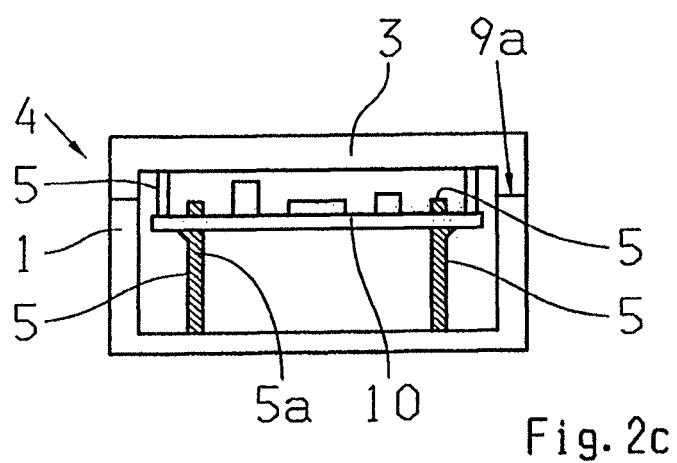

FIGS. 2a) to c) illustrate the possibility of provisionally fixing the functional component 2 to one joint partner 1, 3 and gripping it in a final fixing position between the joint partners by means of fixing elements 5. For the provisional fixing or, as in the present case for example also for the final fixing or gripping of a functional component 2 such as a printed circuit 10, for example the first housing portion 1 has one or more fixing elements 5, for example projecting in the direction of the functional component 2 to be fixed, in order to make contact with it and in particular to fix it provisionally in the specified fixing position. A fixing element 5 can be for example a dome, a contact or pressure element, a pin, a shape-fitting element, etc., which can co-operate with fixing aids of the functional component 2 such as holes, etc. The fixing elements 5 co-operate for example in such manner that sideways movement of the functional component 2 perpendicularly to the joining direction X is prevented, so that for example adhesive bonding would also be conceivable. In FIGS. 2a) to c), for example, pins 5a provided with a resting surface for the functional component 2, projecting from the first housing portion 1, pass through holes in the functional component 2.

Furthermore, for example the second housing portion 3 to be connected to the first housing portion 1 also comprises fixing elements 5 which, as a result of the material melting in order to form a material-integral bond, can come in contact, in particular, with specified positions on the functional component 2 without damaging it, in order to fix it firmly and/or without play in the specified fixing position. Provision can be made for forming the fixing elements 5 of the second housing portion 3 as described above for those of the first housing portion 1, for example making them rigid or yielding, and in the case of yielding fixing elements appropriate gripping can be achieved by pressure monitoring.

Figure 3A:
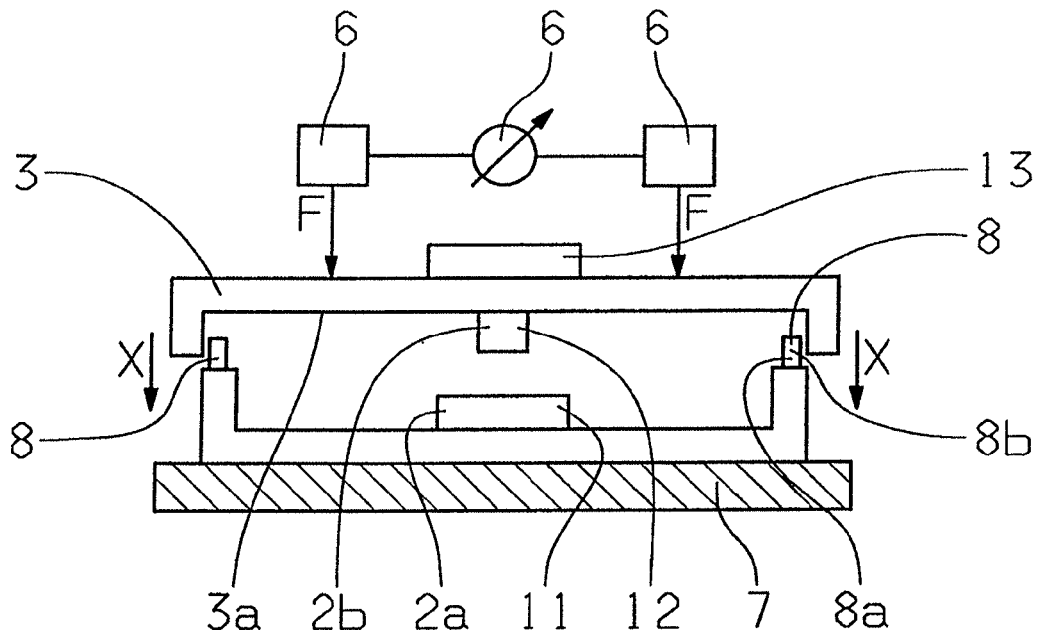
FIGS. 3a) and b) Example showing an arrangement according to a further possible embodiment of the invention, in which two mutually opposite functional components are clamped between a first and second housing portion by forming the material-integral bond.
Figure 3B:
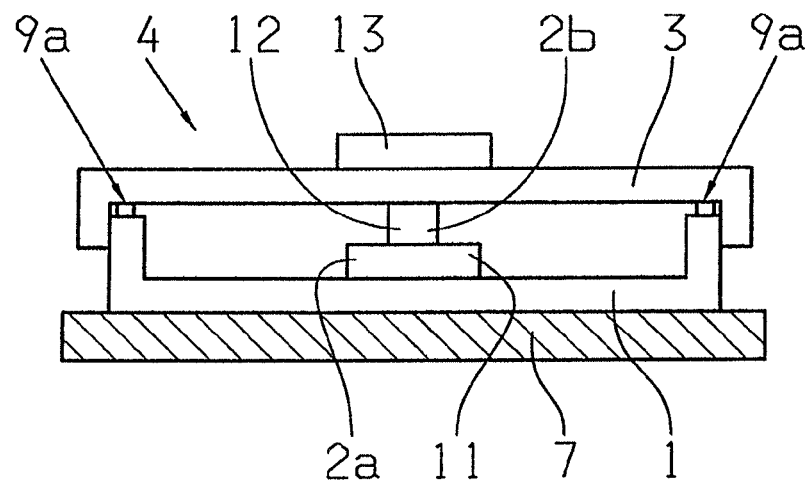

According to the invention it is also envisaged to arrange two or more functional components 2 in the housing 4, especially functional components 2a, 2b that co-operate with one another, as used for example to produce a sensor system of a sensor arrangement. Such an arrangement is shown in FIGS. 3a) and 3b). Functional components 2a, 2b of this type can be ones which are used for creating a sensor system sensitive to magnetic flux, for example comprising a Hall sensor 11 on which a flux-conducting element 12 has to be arranged with the least possible tolerance variation. In such an arrangement it is envisaged, for example, that the functional components 2a, 2b are opposite one another in the housing 4 to be formed, particularly in the joining direction X.

To fix two functional components 2a, 2b which are to be arranged opposite one another in the housing 4, for example in the first step, the first functional component 2a is positioned provisionally in the first housing portion 1, for example in the manner described above, i.e. by means of fixing elements 5 provided for the purpose. Then, in an intermediate step such as between the first and second steps, the second functional component 2b is positioned in the second housing portion 3, for example fixed provisionally, although the provisional fixing can in each case be a final fixing of the first 2a or second 2b functional component relative to the respective housing portion 1 or 3 which holds it. In the second step the first 1 and second 3 housing portions are now, in the manner described earlier, positioned in contact with one another so that the first 2a and second 2b functional components are opposite one another, i.e. in the joining direction X, in the intended fixing position.

In the subsequent third step, material of the contact elements 8 between the joint partners 1, 3, provided between them in order to form the interlocked connection, is melted as described earlier, i.e. until the first functional component 2a comes into contact with the second functional component 2b, for example on contact or abutment surfaces provided for the purpose and with the intended contact pressure force. The two functional components 2a, 2b are now between the first 1 and second 3 housing portions, in particular gripped by them and fixed opposite one another in the intended position unaffected by tolerances and secured against slipping. In the case of the sensor described above, as a result of this gripping, the face of the Hall sensor 11 arranged for example on the first housing portion 1 is in planar contact with the flux-conducting element 12 that co-operates with it.

FIGS. 3a) and b) also illustrate the possibility that in the second step the first 1 and second 3 housing portions can be positioned in contact with one another with overlap in such manner that the material-integral bond can be formed between a face 3a of the second housing portion 3 and a fusible welding fillet 8b of the first housing portion 1, while a converse arrangement in which the face is on the first housing portion 1 is also conceivable. By virtue of the overlap, the housing portions 1, 3 can be guided relative to one another during the joining process and, for example, a housing 4 so produced can be highly impermeable.

By means of the method described, an arrangement of a first 1 and second 3 housing portion and a functional component 2, in particular a sensor arrangement can be produced, in which a functional component 2 or two functional components 2a, 2b opposite one another is/are fixed by the housing portions 1, 3 secured against displacement and in exact positions, within the housing 4 so formed. The first and second 3 housing portions can for example be parts of a sensor housing. The functional components 2 or 2a or 2b can for example be elements of the sensor system of a sensor, such as a printed circuit, a flux-conducting element or a Hall sensor. For example, according to the invention a sensor arrangement can be produced in which the distance of the sensor system 11, 12 in the housing 4 from the outside 4a of the housing parallel to the joining direction can be made exact, for example the distance to another functional component 13 positioned outside the housing 4, such as a magnet guide or a magnet 13.

With the method according to the invention the tolerance chain can be minimized, such that the length of the settling path is always chosen to give a reliably processed weld, in particular a laser weld (welding with settling path onto a block). The material displaced during welding forms no connection, in particular no interlocking connection, with the functional component.

INDEXES

1 First housing portion
2 Functional component
2a First functional component
2b Second component
3 Second housing portion
3a End face
4 Housing
4a Outside of housing
5 Fixing element
5a Pin with contact surface
6 Pressing device
7 Base support
8 Contact element
8a Fusible area of material
8b Welding fillet
9 Contact position
9a Weld seam
10 Printed circuit
11 Hall sensor
12 Flux-conducting element
13 Other functional component
F Pressure force
X Joining direction

The invention claimed is:

1. A method of fixing a functional component (2) in a housing (4), the method comprising the steps of:
preparing a first housing portion (1) by arranging the functional component (2), which is to be fixed, in a provisional fixing position;
arranging a second housing portion (3) in contact with the first housing portion (1) such that the functional component (2), which is to be fixed, is positioned in a joining direction (X) between the first housing portion (1) and the second housing portion (3) and initially spaced from the second housing portion;
melting material of at least one of the first housing portion (1) and the second housing portion (3) between the first housing portion (1) and the second housing portion (3) such that the functional component (2) between the first housing portion (1) and the second housing portion (3) is retained in a desired fixing position by the first housing portion (1) and the second housing portion (3) when a material-integral bond is formed between the first housing portion (1) and the second housing portion (3); and
monitoring pressure during the step of melting the material to grip the functional component (2) between the first housing portion (1) and the second housing portion (3) with an intended pressure force (F) by virtue of the material-integral bond.

2. The method according to claim 1, further comprising the step of pressing the first housing portion (1) and the second housing portion (3) against one another in the joining direction (X) during the step of melting the material of at least one of the first housing portion (1) and the second housing portion (3).

3. The method according to claim 1, further comprising the step of melting, via a laser welding process, the material of at least one of the first housing portion (1) and the second housing portion (3).

4. The method according to claim 1, further comprising the step of the providing at least one of the first housing portion (1) and the second housing portion (3) with an area (8a) of fusible material for forming the material-integral bond.

5. The method according to claim 1, further comprising the step of producing the housing (4) which is impermeable to media and contains the functional component (2) by virtue of the material-integral bond formed between the first housing portion (1) and the second housing portion (3).

6. The method according to claim 1, further comprising the step of positioning a second functional component (2b) in the second housing portion (3) in a provisional fixing position such that the second functional component (2b) is opposite the first functional component (2a) in the joining direction (X).

7. The method according to claim 6, further comprising the step of forming the material-integral bond after being gripped such that the first functional component (2a) and the second functional component (2b) contact one another.

8. The method according to claim 1, further comprising the step of providing at least one of the first housing portion (1) and the second housing portion (3) with a fixing element (5) for provisionally fixing of the functional component (2) before gripping the functional component (2).

9. The method according to claim 1, further comprising the step of forming a sensor housing (4) with the first housing portion (1) and the second housing portion (3).

10. The method according to claim 1, further comprising the step of using one of a printed circuit (10), a Hall sensor (11) and a flux-conducting sheet (12) as the functional component (2).

* * * * *